United States Patent
Miller et al.

(12) 
(10) Patent No.: US 6,858,930 B2
(45) Date of Patent: Feb. 22, 2005

(54) MULTI CHIP MODULE

(75) Inventors: Leah M. Miller, Fremont, CA (US); Kishor Desai, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/638,772

(22) Filed: Aug. 11, 2003

(65) Prior Publication Data

US 2004/0065951 A1 Apr. 8, 2004

Related U.S. Application Data

(62) Division of application No. 10/265,751, filed on Oct. 7, 2002, now Pat. No. 6,680,532.

(51) Int. Cl.[7] .............................................. H01L 23/10
(52) U.S. Cl. ........................ 257/706; 257/707; 257/712; 257/713; 257/762
(58) Field of Search .............................. 257/706, 707, 257/712, 713, 762; 361/702, 709, 712; 261/713

(56) References Cited

FOREIGN PATENT DOCUMENTS

| JP | 64-47058 | * | 2/1989 | .................. 257/706 |
|---|---|---|---|---|
| JP | 1-199439 | * | 8/1989 | .................. 257/706 |

* cited by examiner

*Primary Examiner*—Jasmine Clark
(74) *Attorney, Agent, or Firm*—Luedeka, Neely & Graham, P.C.

(57) ABSTRACT

A multi chip package, which includes a package substrate having a first side and an opposing second side. The first side is for receiving package electrical connections. Integrated circuits are electrically connected and structurally connected by their first sides to the second side of the package substrate. Heat spreaders are disposed adjacent the second side of the integrated circuits, where one each of the heat spreaders is associated with one each of the integrated circuits. A single stiffener having a first side and an opposing second side covers all of the integrated circuits and heat spreaders, where the first side of the stiffener is disposed adjacent the second side of the heat spreaders.

18 Claims, 2 Drawing Sheets

MULTI CHIP MODULE

This is a divisional of application Ser. No. 10/265,751 filed Oct. 7, 2002 now U.S. Pat. No. 6,680,532.

FIELD

This invention relates to the field of integrated circuit fabrication. More particularly, this invention relates to packaging of integrated circuits.

BACKGROUND

It is often desirable to have two or more integrated circuits packaged together. For example, it is often convenient to have one or more logic integrated circuits, such as application specific integrated circuits, packaged with one or more memory integrated circuits, such as random access memory and read only memory. In such an arrangement, the memory integrated circuits can conveniently contain information such as operational instructions for the logic integrated circuit and, additionally, other memory integrated circuits can also receive information that is sent from or is to be sent to other circuits. By placing such desired integrated circuits within a single package, a designer can generally increase the speed and reduce the complexity and cost of the overall circuit design. Circuit reliability and tolerance may also increase.

Because of the device density of most integrated circuits, they tend to produce an appreciable amount of thermal energy, which is released as heat. Also, as there is a desire to continually reduce the size of completed integrated circuits, including the packaging, many packaging materials are somewhat flexible. These two factors of heat production and package flexibility tend to place certain constraints on integrated circuit package design. For example, because of the heat that is produced by an integrated circuit, a heat spreader is typically added to the package. The heat spreader is intended to conduct heat away from the integrated circuit. Typically, the heat spreader is placed on the top of the package as a lid.

Next, because the packages tend to be somewhat flexible, stiffener rings are typically included in a package design, to increase the rigidity and overall structural integrity of the package design. The stiffener ring is typically an annular structure that is placed around an integrated circuit, which resides within a center void of the stiffener ring, and which is coplanar with the stiffener ring.

However, when there are more than one integrated circuit within a single package, the use of stiffener rings becomes more complex. If a stiffener ring is added around each integrated circuit in the package, then a relatively large amount of space is used for stiffener rings, which increases the size of the package. However, if a stiffener ring is omitted from one or more of the integrated circuits, then the structural integrity of the package is somewhat compromised.

What is needed, therefore, is a package design that provides adequate heat dissipation and structural support for a multi chip module.

SUMMARY

The above and other needs are met by a multi chip package according to the present invention, which includes a package substrate having a first side and an opposing second side. The first side is for receiving package electrical connections. Integrated circuits are electrically connected and structurally connected by their first sides to the second side of the package substrate. Heat spreaders are disposed adjacent the second side of the integrated circuits, where one each of the heat spreaders is associated with one each of the integrated circuits. A single stiffener having a first side and an opposing second side covers all of the integrated circuits and heat spreaders, where the first side of the stiffener is disposed adjacent the second side of the heat spreaders.

In this manner, a single stiffener is used for the integrated circuit package, where the stiffener is disposed on a layer that is not coplanar with the integrated circuits. Thus, the integrated circuits may be placed closer together, and the overall surface area size of the integrated circuit package can be reduced without compromising the structural integrity of the integrated circuit package, as would tend to occur by merely removing one or more stiffeners. In addition, a separate heat spreader is dedicated to each monolithic integrated circuit, thereby improving heat dissipation from the integrated circuits individually, and thereby from the package generally.

In various preferred embodiments of the invention, a thermal epoxy is disposed between the second side of each of the integrated circuits and the first side of each of the heat spreaders, where the thermal epoxy conducts thermal energy to the heat spreaders and away from the integrated circuits. Additionally, a thermal epoxy is preferably disposed between the second side of each of the heat spreaders and the first side of the stiffener, where the thermal epoxy conducts thermal energy to the stiffener and away from the heat spreaders. Preferably, discrete components are also electrically connected to the second side of the package substrate, coplanar with the integrated circuits. In a most preferred embodiment, ball grid array package electrical connections are disposed on the first side of the package substrate. The heat spreaders and the stiffener are preferably formed of copper.

According to another aspect of the invention there is provided a multi chip package, which includes a package substrate having a first side and an opposing second side. The first side is for receiving package electrical connections. Integrated circuits are electrically connected and structurally connected by their first sides to the second side of the package substrate. Heat spreaders are disposed adjacent the second side of the integrated circuits, where a single one of the heat spreaders is associated with a single one of the integrated circuits, but not all of the integrated circuits have an associated heat spreader. A single stiffener having a first side and an opposing second side covers all of the integrated circuits and heat spreaders, where the first side of the stiffener is disposed adjacent the second side of the heat spreaders.

According to yet another aspect of the invention there is provided a multi chip package, which includes a package substrate having a first side and an opposing second side. The first side is for receiving package electrical connections. Integrated circuits are electrically connected and structurally connected by their first sides to the second side of the package substrate. Heat spreaders are disposed adjacent the second side of the integrated circuits, where one each of the heat spreaders is associated with one each of the integrated circuits. A single stiffener having a first side and an opposing second side covers some but not all of the integrated circuits and heat spreaders, where the first side of the stiffener is disposed adjacent the second side of the heat spreaders.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
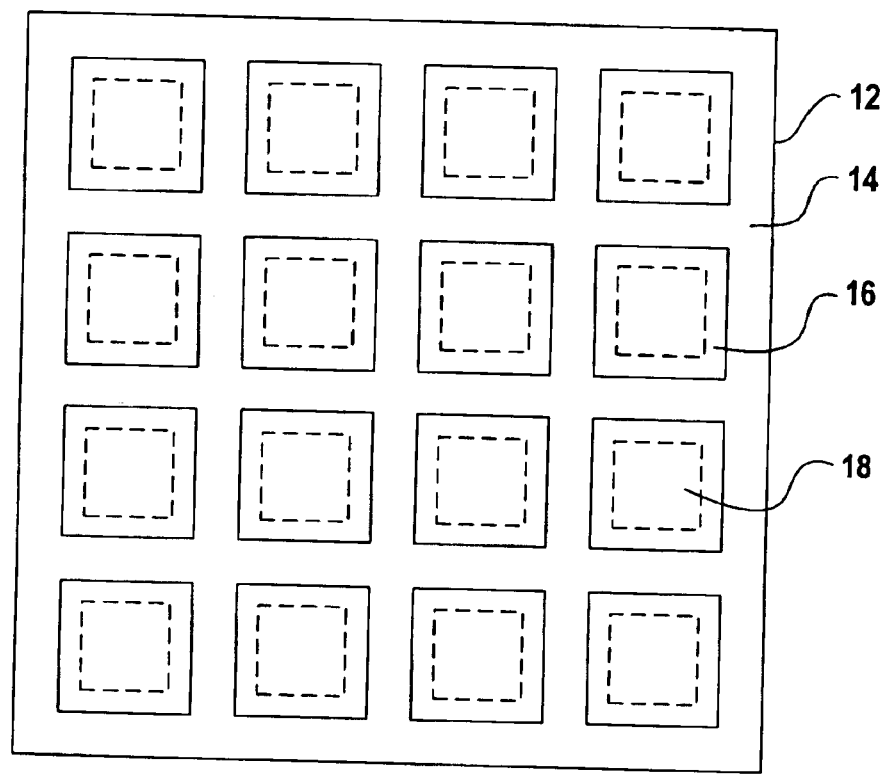
FIG. 1 is a top plan view of a first embodiment of an integrated circuit package according to the present invention.
Figure 2:
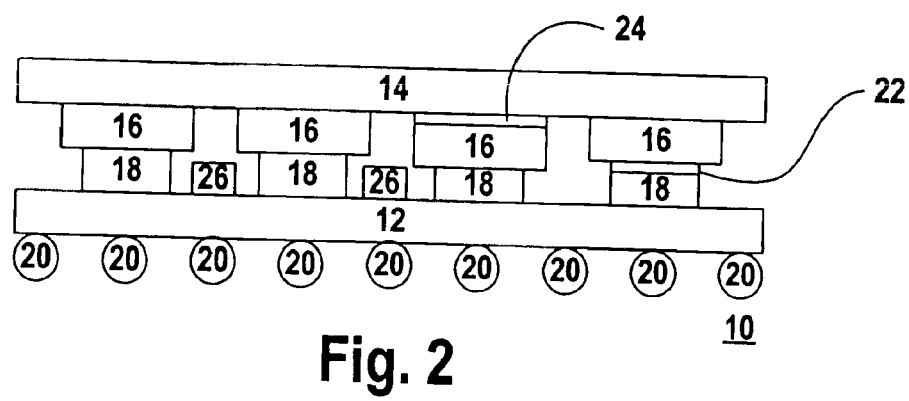
FIG. 2 is a cross sectional view of the first embodiment of the integrated circuit package according to the present invention.

With reference now to FIG. 1, there is depicted a top plan view of a first embodiment of an integrated circuit package 10 according to the present invention, showing the general positions of an underlying package substrate 12, overlying stiffener 14, and integrated circuits 18 with associated heat spreaders 16 disposed between the package substrate 12 on the bottom and the stiffener 14 on the top. FIG. 2 depicts a cross sectional view of the same general embodiment of FIG. 1, also showing electrical connections 20 on the bottom of the package substrate 12, in the form of a ball grid array.

As depicted in FIG. 2, there is preferably a thermal epoxy 22 disposed between the integrated circuits 18 and the heat spreaders 16, and a thermal epoxy 24 disposed between the heat spreaders 16 and the stiffener 14. Preferably, the thermal epoxy is disposed between all such structures as described above, but is only depicted in two places in FIG. 2, so as to depict that the thermal epoxy 22 or 24 may be used as a height leveling medium within the package 10. For example, when an integrated circuit 18 is shorter than others of the integrated circuits, then the extra gap can either be taken up in an additional thickness of the thermal epoxy 22 between the integrated circuit 18 and the heat spreader 16, or alternately can be taken up in an additional thickness of the thermal epoxy 24 between the heat spreader 16 and the stiffener 14. Further still, the additional thickness may be taken up as an additional thickness of both the thermal epoxy 22 and the thermal epoxy 24.

Also depicted in FIG. 2 are discrete components 26, such as resistors and capacitors, which are also electrically connected to the package substrate 12, and which are generally coplanar with the integrated circuits 18.

In the preferred embodiment of the invention, there is only a single stiffener 14, which thereby provides good structure support to the package 10. Most preferably, the stiffener 14 covers all of the integrated circuits 18 and all of the heat spreaders 16. There is preferably a heat spreader 16 associate with each of the integrated circuits 18. However, in various alternate embodiments, such as generally depicted in FIGS. 3 and 4, either the stiffener 14 does not cover all of the integrated circuits 18 and all of the heat spreaders 16, or some of the integrated circuits 18 do not have an associated heat spreader 16, or there is a combination of these two conditions.

Figure 3:
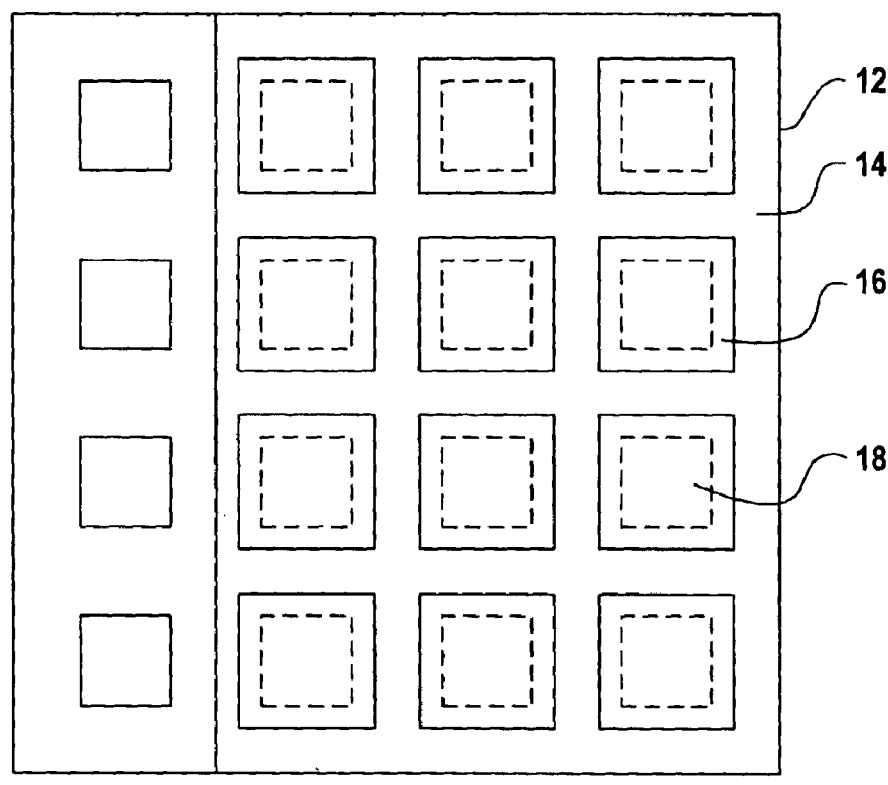
FIG. 3 is a top plan view of a second embodiment of the integrated circuit package according to the present invention.
Figure 4:
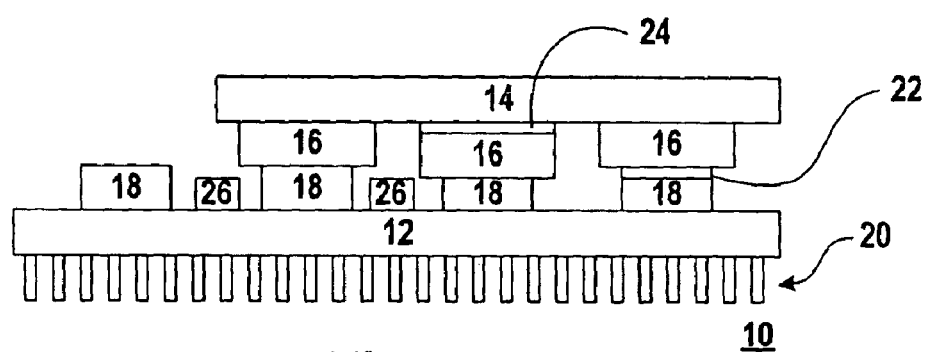
FIG. 4 is a cross sectional view of the second embodiment of the integrated circuit package according to the present invention.

For example, as specifically depicted in FIGS. 3 and 4, the first column of integrated circuits 18 do not have associated heat spreaders 16, and the stiffener does not cover that first column of integrated circuits 18. It is appreciated that this is by way of example and not limitation. In various embodiments, there may be a different number of integrated circuits 18, different ones of the integrated circuits 18 may have associated heat spreaders 16, the stiffener 14 may leave different ones of the heat spreaders 16 and integrated circuits 18 uncovered, and the integrated circuits 18, whether covered or uncovered by the stiffener 14, may or may not have associated heat spreaders 16. FIG. 4 also depicts alternate electrical connections 20 on the bottom of the package substrate 12, in the form of pins. It is appreciated that the invention is not limited to the specific case of either pins or ball grid arrays, but is applicable to other types of package electrical connections 20 as well.

In a preferred embodiment, the heat spreaders 16 and the stiffener 14 are all formed of a material that conducts heat relatively well, such as a metal. Most preferably, the heat spreaders 16 and the stiffener 14 are both formed of copper. However, it is not required that both the heat spreaders 16 and the stiffener 14 be formed of the same material, but may be formed of other materials that are compatible with the functions, structures, and processes as described and implied herein.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A multi chip package, comprising:
   a package substrate having a first side and an opposing second side, the first side for receiving package electrical connections,
   integrated circuits each having a first side and an opposing second side, the first side of each of the integrated circuits electrically connected and structurally connected to the second side of the package substrate,
   heat spreaders each having a first side and an opposing second side, the first side of each of the heat spreaders disposed adjacent the second side of the integrated circuits, where one each of the heat spreaders is associated with one each of the integrated circuits,
   a single stiffener having a first side and an opposing second side, the stiffener covering all of the integrated circuits and heat spreaders, the first side of the stiffener disposed adjacent the second side of the heat spreaders, and
   discrete components electrically connected to the second side of the package substrate and coplanar with the integrated circuits.

2. The multi chip package of claim 1, further comprising ball grid array package electrical connections disposed on the first side of the package substrate.

3. The multi chip package of claim 1, wherein the heat spreaders are formed of copper.

4. The multi chip package of claim 1, wherein the stiffener is formed of copper.

5. A multi chip package, comprising:
a package substrate having a first side and an opposing second side, the first side for receiving package electrical connections,
integrated circuits each having a first side and an opposing second side, the first side of each of the integrated circuits electrically connected and structurally connected to the second side of the package substrate,
heat spreaders each having a first side and an opposing second side, the first side of each of the heat spreaders disposed adjacent the second side of the integrated circuits, where one each of the heat spreaders is associated with one each of the integrated circuits,
a thermal epoxy disposed between the second side of each of the integrated circuits and the first side of each of the heat spreaders, the thermal epoxy for conducting thermal energy to the heat spreaders and away from the integrated circuits, and
a single stiffener having a first side and an opposing second side, the stiffener covering all of the integrated circuits and heat spreaders, the first side of the stiffener disposed adjacent the second side of the heat spreaders.

6. The multi chip package of claim 5, further comprising ball grid array package electrical connections disposed on the first side of the package substrate.

7. The multi chip package of claim 5, wherein the heat spreaders are formed of copper.

8. The multi chip package of claim 5, wherein the stiffener is formed of copper.

9. A multi chip package, comprising:
a package substrate having a first side and an opposing second side, the first side for receiving package electrical connections,
integrated circuits each having a first side and an opposing second side, the first side of each of the integrated circuits electrically connected and structurally connected to the second side of the package substrate,
heat spreaders each having a first side and an opposing second side, the first side of each of the heat spreaders disposed adjacent the second side of the integrated circuits, where one each of the heat spreaders is associated with one each of the integrated circuits,
a single stiffener having a first side and an opposing second side, the stiffener covering all of the integrated circuits and heat spreaders, the first side of the stiffener disposed adjacent the second side of the heat spreaders, and
a thermal epoxy disposed between the second side of each of the heat spreaders and the first side of the stiffener, the thermal epoxy for conducting thermal energy to the stiffener and away from the heat spreaders.

10. The multi chip package of claim 9, further comprising ball grid array package electrical connections disposed on the first side of the package substrate.

11. The multi chip package of claim 9, wherein the heat spreaders are formed of copper.

12. The multi chip package of claim 9, wherein the stiffener is formed of copper.

13. A multi chip package, comprising:
a package substrate having a first side and an opposing second side, the first side for receiving package electrical connections,
integrated circuits each having a first side and an opposing second side, the first side of each of the integrated circuits electrically connected and structurally connected to the second side of the package substrate,
heat spreaders each having a first side and an opposing second side, the first side of each of the heat spreaders disposed adjacent the second side of the integrated circuits, where one each of the heat spreaders is associated with one each of the integrated circuits, and
a single stiffener having a first side and an opposing second side, the stiffener covering some but not all of the integrated circuits and heat spreaders, the first side of the stiffener disposed adjacent the second side of the heat spreaders.

14. The multi chip package of claim 13, further comprising a thermal epoxy disposed between the second side of each of the integrated circuits and the first side of each of the heat spreaders, the thermal epoxy for conducting thermal energy to the heat spreaders and away from the integrated circuits.

15. The multi chip package of claim 13, further comprising a thermal epoxy disposed between the second side of each of the heat spreaders and the first side of the stiffener, the thermal epoxy for conducting thermal energy to the stiffener and away from the heat spreaders.

16. The multi chip package of claim 13, further comprising discrete components electrically connected to the second side of the package substrate and coplanar with the integrated circuits.

17. The multi chip package of claim 13, further comprising bail grid array package electrical connections disposed on the first side of the package substrate.

18. The multi chip package of claim 13, wherein the heat spreaders are formed of copper.

* * * * *